United States Patent [19]

Oyama

[11] Patent Number: 5,637,897
[45] Date of Patent: Jun. 10, 1997

[54] NONVOLATILE SEMICONDUCTOR MEMORY DEVICE WITH DUAL INSULATION LAYERS BETWEEN ADJACENT GATE STRUCTURES

[75] Inventor: Ken-Ichi Oyama, Tokyo, Japan

[73] Assignee: NEC Corporation, Japan

[21] Appl. No.: 606,477

[22] Filed: Mar. 4, 1996

[30] Foreign Application Priority Data

Mar. 6, 1995 [JP] Japan ................................ 7-070411

[51] Int. Cl.$^6$ ................................ H01L 29/788
[52] U.S. Cl. ........................ 257/320; 257/315; 257/321; 257/324; 365/185.29; 365/185.33
[58] Field of Search ............................. 257/321, 315, 257/316, 324, 320; 365/185.29, 185.33, 185.01

[56] References Cited

U.S. PATENT DOCUMENTS

| | | | |
|---|---|---|---|
| 5,053,841 | 10/1991 | Miyakawa et al. | 257/321 |
| 5,252,846 | 10/1993 | Tanaka et al. | 257/320 |

FOREIGN PATENT DOCUMENTS 2292870  12/1990  Japan.

Primary Examiner—Jerome Jackson
Attorney, Agent, or Firm—Hayes, Soloway, Hennessey, Grossman & Hage, P.C.

[57] ABSTRACT

A non-volatile semiconductor memory, called EPROM has a plurality of memory cells arrayed in a matrix and each having a laminate gate structure including a part of a strip control gate and a separate floating gate. A plurality of erasing gates is disposed in one of each two of spaces formed between two adjacent gate structures. Other of the each two of the spaces is filled with a laminate including a silicon nitride film and a silicon oxide film overlying the silicon nitride film. The erasing gates and the laminates are arranged alternately, so that the laminates do not cover the erasing gates. Difference in level between the memory cell section and the peripheral section is reduced to thereby prevent breakage of interconnects overlying the erasing gates. Etching of the substrate surface can be avoided to thereby obtain an improvement in the yield of the memory device.

3 Claims, 7 Drawing Sheets

NONVOLATILE SEMICONDUCTOR MEMORY DEVICE WITH DUAL INSULATION LAYERS BETWEEN ADJACENT GATE STRUCTURES

BACKGROUND OF THE INVENTION (a) Field of the Invention

The present invention relates to a nonvolatile semiconductor memory device and a method for manufacturing the same. In particular, the present invention relates to a nonvolatile semiconductor memory, such as a virtual ground split gate EPROM, in which insulating films and erasing gates are alternately formed in spaces between each adjacent two of control gates, and a method for manufacturing such a nonvolatile semiconductor memory device.

(b) Description of the Related Art

A virtual ground split gate EPROM (referred to as simply EPROM hereinafter) has been proposed for increasing the scale in integration and the yield of EPROMs. A conventional EPROM will be described with reference to drawings. FIG. 1 shows a schematic plan view of the conventional EPROM while FIG. 2 is a cross-sectional view of the same along line B—B in FIG. 1.

Referring to FIGS. 1 and 2, $n^+$-type buried diffusion (diffused) layers 14 constituting source/drain regions are formed within a surface region of a p-type silicon substrate 1 such that the buried diffusion layers 14 extend parallel to one anther in a column direction (vertical direction as viewed in FIG. 1). The $n^+$-type buried diffusion layers 14 are covered by a relatively thick silicon oxide film 15. Element separation films or field oxide film 2 are formed such that they extend parallel to one another on the substrate in a row direction. Floating gates 4 overlying the substrate 1 are formed in a matrix such that each of the floating gates 4 partially overlaps a corresponding one of the buried diffusion layers 14. Further, control gates 6 overly the respective rows of floating gates 4 to extend in the row direction, the control gates 6 constituting laminate gate structures together with the respective floating gates 4. The surfaces of the control gates 6 are covered by a silicon oxide film 7. One of each adjacent two of spaces formed between two adjacent gate structures is filled with erasing gates 12. The entire surface of the substrate is further covered by a silicon oxide film 16.

Referring to FIG. 3 which shows an equivalent circuit of the memory cell array shown in FIG. 1, the $n^+$-type buried diffusion layers 14 form bit lines B1, B2, etc., while the control gates 6 form word lines W1, W2, etc. The channel portion of each memory cell includes two split regions as shown in FIG. 3. In the first region, the control gate 6 opposes the channel region with the intervention of the floating gate 4 disposed therebetween. In the second region, the control gate 6 directly opposes the channel portion. This structure is called a "split gate" type.

To read out data from a memory cell (2, 1) in FIG. 3, for example, i.e., a memory cell disposed at a second row and a first column, voltage of 5 V is applied to a word line W2, a bit line B1 is grounded, and a voltage of 1.5 V is applied to a bit line B2. Other non-selected word lines W1, W3, W4 etc. are grounded while other non-selected bit lines B3, B4 etc. are left in a floating state.

To write data into the memory cell (2, 1), a voltage of 12 V is applied to the word line W2, the bit line B1 is grounded, and a voltage of 7 V is applied to the bit line B2. Other non-selected word lines W1, W3, W4 etc. are grounded. With this state, hot electrons are generated in the channel of the memory cell (2, 1) and injected into the floating gate 4 thereof.

To erase data in the memory cells, the word lines W1, W2 etc. are grounded and a voltage of 20 V, for example, is applied to erasing gates 12 so as to withdraw carriers from the floating gates 4 to the erasing gates 12.

As described above, the conventional virtual ground split gate EPROM has two important structural features, i.e., having the $n^+$-type buried diffusion layers as bit lines, and having serially connected section transistors, so called of split gate type, in each memory cell having a floating gate. The use of $n^+$-type buried bit lines greatly reduces the number of contacts required in the memory cell array, thereby increasing the scale in integration and the yield of the device.

By the serial selection transistors provided for each memory cell, it is possible to avoid the problem that ON current erroneously flows through non-selected memory cells connected to a selected bit line even when a voltage is applied to the floating gates of these non-selected memory cells due to the voltage on the bit line to thereby turn-on the non-selected memory cells. This greatly reduces the restriction on the drain voltage for programming. An EPROM of this type is described in Patent Publication No. JP-A-1990-292870, for example.

Next, a conventional method for manufacturing an EPROM of the type as described above will be described with reference to FIGS. 4A and 4B showing consecutive steps of the process in memory cell array section 20 and peripheral circuit section 30.

An unillustrated photoresist film is selectively formed on a p-type silicon substrate 1, then $n^+$-type buried diffusion layers not shown in FIGS. 4A and 4B and constituting bit lines are formed by ion implantation using the photoresist film as a mask.

After removal of the photoresist film, a silicon oxide film is deposited over the entire surface of the substrate 1 by using a CVD technology. The silicon oxide film is then subjected to patterning so as to form field oxide films 2 within both the cell array section 20 and the peripheral circuit section 30. Thereafter, a gate oxide films 3 is formed, and a 2000 angstrom thick polycrystalline silicon (polysilicon) film for floating gates is deposited thereon. The polysilicon film is subjected to dry etching using a photoresist mask to be formed in a plurality of parallel strips.

After forming consecutively an inter-gate insulating film 5 and a 3500 angstrom thick polysilicon film for control gates, both the polysilicon film for control gates and the polysilicon film for floating gates are subjected to patterning, thereby forming laminate gates structures each including a part of the strip control gate 6 and the separate floating gate 4. At this time, the polysilicon films are removed from the peripheral circuit section 30.

By subsequent thermal oxidation, a 100 angstrom thick silicon oxide film 7 is formed on the control gates, on the floating gates 6, and on the exposed portions of the substrate surface. The silicon oxide film 7 serves as a gate oxide film within the peripheral circuit section 30. Subsequently, a polysilicon film 12a for use in forming erasing gates is deposited to a thickness of about 2500 angstroms such that the spaces between two adjacent gate structures are filled with the polysilicon film 12a. Thereafter, a photoresist film 17 is formed using photolithography, thus obtaining the structure of FIG. 4A.

Subsequently, the polysilicon film 12a is patterned by a dry etching technology using the photoresist film 17 as a mask so as to form erasing gates 12 which bury one of each two of spaces formed between two adjacent gate structures and so as to form gate electrodes 13 within the peripheral circuit section 30. Thereafter, a silicon oxide film 16 is deposited on the entire surface including the vacant spaces between the gate structures as well as the surfaces of the erasing gates by using a CVD technology, thereby obtaining the structure of FIG. 4B. Finally, remaining processes such as formation of interconnets are carried out to complete a nonvolatile semiconductor memory device.

The conventional EPROM as described above has the following drawbacks. That is, in the conventional EPROM, the erasing gates 12 in the cell array section 20 and the gate electrodes 13 in the peripheral circuit are made from the same polysilicon film and are patterned using a photolithographic dry etching technology during the same patterning step. At this time, it is necessary within the cell array section to remove the polysilicon film 12a for the erasing gates buried in the other of each two of the spaces formed between the gate structures. The thickness of the polysilicon film 12a is as high as about 8000 angstroms (2000+3500+2500). In contrast, the thickness of the polysilicon film within the peripheral circuit section is about 2500 angstroms. Therefore, the latter area is subjected to excessive etching during the time period required to remove the polysilicon film having a thickness of 5500 angstroms.

Although the 100 angstrom thick gate oxide film 7 formed by thermal oxidization may be desired to stop excessive etching, the thickness of the silicon oxide film 7 is insufficient to stop the excessive etching. Therefore, the surface of the silicon substrate 1 is subjected to etching, so that the silicon surface includes an etched portion 18 shown in FIG. 4B. The etched portion 18 causes variations in the device sizes (channel length, for example) of transistors of the peripheral circuit, resulting in increased variations in the characteristics of the transistors. Further, the yield of the device decreases accordingly.

The conventional EPROM has another drawback in that a difference in level is produced at the boundary between the cell array section and the peripheral circuit section before the step for forming interconnects. That is, since a plurality of thin films are laminated within the cell array section 20, the total thickness of the layers within the cell array section 20 is much greater than that within the peripheral circuit section 30 to produce the difference in level. This may cause a defects or breakage in the overlying interconnects, resulting in a decreased manufacturing yield of the memory device.

SUMMARY OF THE INVENTION

In view of the foregoing, it is an object of the present invention to provide a nonvolatile semiconductor memory device which can prevent excessive etching of a polysilicon film, which would otherwise occur when the gate electrodes of transistors are formed within a peripheral circuit section.

Another object of the present invention is to provide a nonvolatile semiconductor memory device which can decrease the difference in level between a cell array section and the peripheral circuit section.

The present invention provides a non-volatile semiconductor memory device comprising a semiconductor substrate, a plurality of floating gates overlying the substrate and arranged along a row and a column directions in a matrix, a plurality of strip control gates each overlying each row of the floating gates, a plurality of insulating layers disposed in one of each two of spaces formed between each adjacent two of the control gates, a plurality of erasing gates disposed in the other of the each two of spaces, the insulating films and erasing gates being arranged alternately, each of the insulating layers including a silicon nitride film and a silicon oxide film overlying the silicon nitride film.

The present invention further provides a method for forming a non-volatile semiconductor memory device, the method including steps of: forming a first polysilicon film overlying a semiconductor substrate; forming a second polysilicon film overlying the first polysilicon film; patterning the first and second polysilicon films to form a plurality of floating gates arranged in column and row directions in a matrix and a plurality of strip control gates each overlying each row of the floating gate; forming a plurality of strip laminates each including a silicon oxide film and a silicon nitride film overlying the silicon oxide film, the strip laminates being disposed in one of each two of spaces formed between each adjacent two of the control gates; and forming a plurality of erasing gates each disposed in the other of the each two of spaces, the strip laminates and the erasing gate being disposed alternately.

In accordance with the non-volatile semiconductor memory device of the present invention, since dry etching of the polysilicon film for forming the erasing gates is required only in a flat portion, the degree of etching within the cell array section is equal to the degree of etching required for patterning of gate electrodes of transistors within the peripheral circuit section. Therefore, the surface of the silicon substrate within the peripheral circuit section is prevented from being removed due to excessive etching. As a result, variations in device sizes of transistors in the peripheral circuit section due to excessive etching can be prevented. Accordingly, variations in the characteristics of the transistors can be decreased and the yield of memory devices can be increased.

In addition, since the oxide film for burying the spaces between the laminate gate structures is not formed on the erasing gates, the level difference formed between the cell array section and the peripheral circuit section before forming interconnects can be decreased. Accordingly, breakage of the interconnects can be prevented.

The above and other objects, features and advantages of the present invention will be more apparent from the following description.

DETAILED DESCRIPTION OF THE PREFERRED EMBODIMENTS

Figure 1:
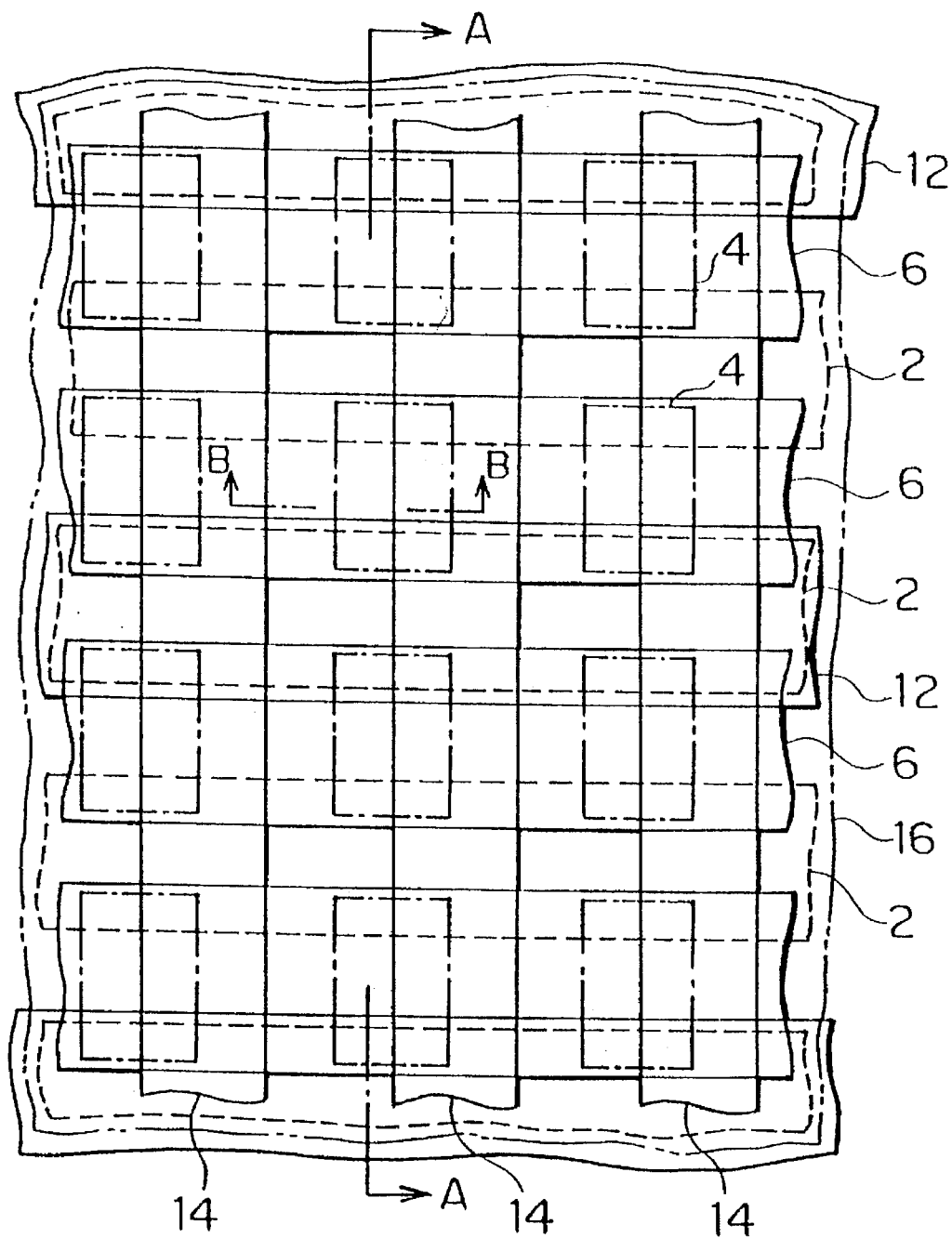
FIG. 1 is a schematic plan view of a memory cell array section of a conventional virtual ground split gate EPROM.
Figure 2:
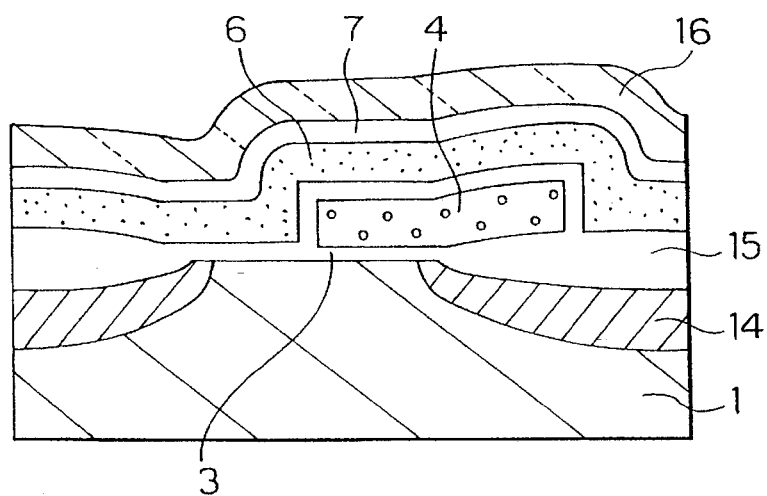
FIG. 2 is a cross-sectional view taken along line B—B in FIG. 1.
Figure 4A:
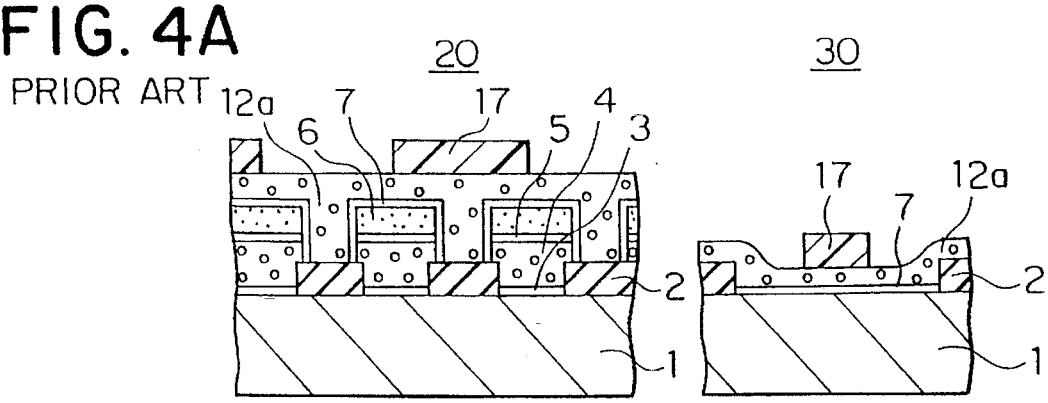
FIGS. 4A and 4B are cross-sectional views showing consecutive steps of a process for manufacturing the EPROM of FIGS. 1 and 2.
Figure 4B:
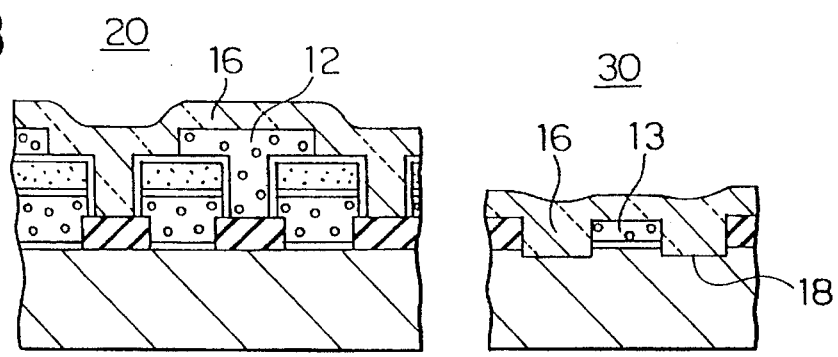
Figure 3:
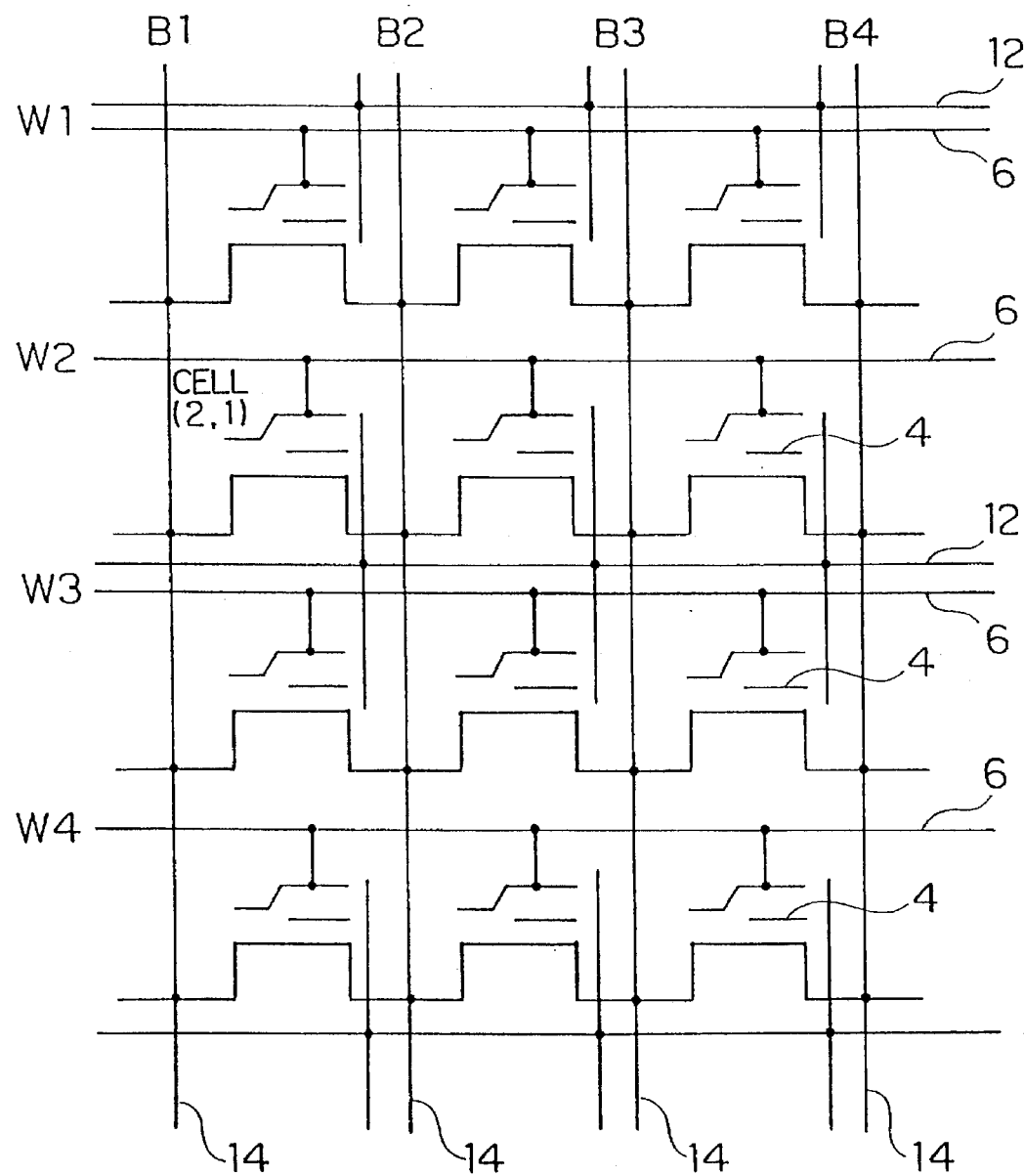
FIG. 3 is an equivalent circuit of the EPROM shown in FIGS. 1 and 2.

Embodiments of the present invention will now be described with reference to the accompanying drawings.

Referring to FIGS. 5A–5F which show a method for manufacturing an EPROM according to a first embodiment of the present invention, a p-type silicon substrate 1 is first prepared. Patterning of a photoresist film not shown and implantation of arsenic ions by using the photoresist film as a mask are then performed to the silicon substrate 1 within a cell array section, so as to form $n^+$-type buried diffusion layers (not shown) in a surface region of the silicon substrate 1 such that the buried diffusion layers extend parallel to another in the column direction, i.e., the direction parallel to the sheet of the drawings.

Next, a silicon oxide film having a thickness of about 4000 angstroms is deposited on the surface of the silicon substrate 1 by a CVD technology. The silicon oxide film is then patterned by a photolithographic dry etching technology so as to form field oxide films 2 extending parallel to one another in the row direction, thereby obtaining the structure of FIG. 5A.

Thereafter, a gate oxide film 3 is formed by thermal oxidization between each adjacent two of the field oxide films 2, and a 2500 angstrom thick polysilicon film is deposited thereon. The polysilicon film is patterned to obtain polysilicon films 4a for use in forming floating gates, which extend in the column direction and partially cover the $n^+$-type buried diffusion layers constituting bit lines.

During the patterning, the polysilicon film 4a is also left within the peripheral circuit section 30. A 200 angstrom thick inter-gate oxide film 5 is then formed on the polysilicon films 4a by a thermal oxidization technology or a HTO (High Temperature CVD Oxide) technology, and a polysilicon film 6a for control gates is deposited thereon to a thickness of 3000 angstrom, thereby obtaining the structure of FIG. 5B.

Next, the polysilicon film 6a, the silicon oxide film 5, and the polysilicon films 4a are patterned by photolithographic dry etching so as to form laminate gate structures each including a part of the strip control gate 6 and the separate floating gate 4 underlying the part of the control gate 6. During this process, the polysilicon film is completely removed from the peripheral circuit section 30.

Although the control gates and the floating gates 4 are formed during the same photolithographic step in the present embodiment, they may be formed during different photolithographic steps. That is, after the patterning of the control gates, a different photoresist film may be formed, and a side of each floating gate parallel to the control gates may be patterned using the photoresist film. Further, a polysilicon film for use in forming control gates may be formed upon completion of the patterning of the floating gates.

Figure 5A:
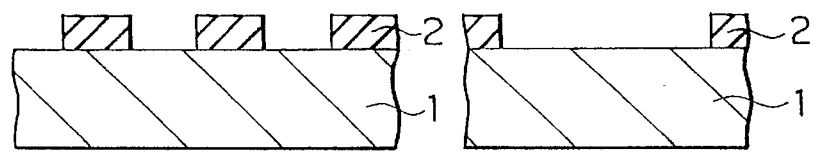
FIGS. 5A–5F are cross-sectional views of a nonvolatile semiconductor memory device according to a first embodiment of the present invention, showing consecutive steps of a process for manufacturing the same.
Figure 5B:
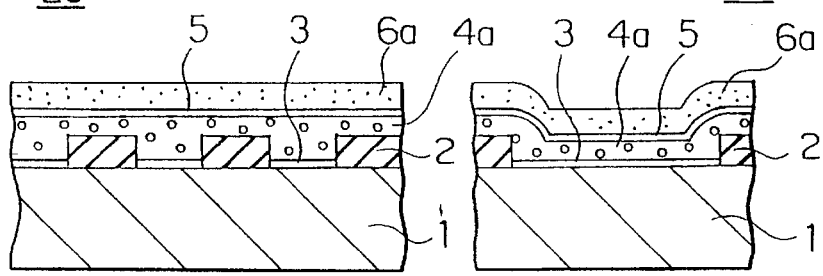
Figure 5C:
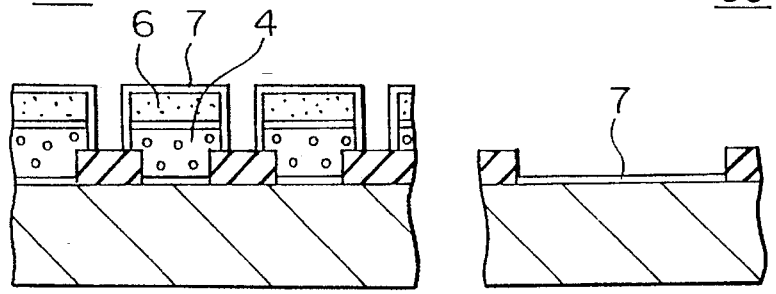

After the formation of the laminate gate structures, thermal oxidation is performed to form a 200 angstrom silicon oxide film 7, which covers the control gates 6, the floating gates 4 and the exposed surface of the silicon substrate 1, thereby obtaining the structure of FIG. 5C.

Figure 5D:
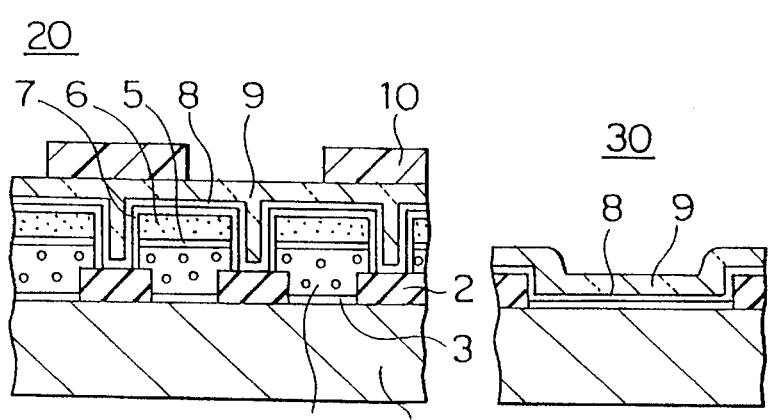

Subsequently, a 500 angstrom thick silicon nitride film 8 and a 2500 angstrom thick silicon oxide film 9 are successively deposited by a CVD technology over the entire surface of the substrate 1 including the spaces between adjacent two of the laminate gate structures and on the laminate gate structures. As a result, the spaces between adjacent two of the laminate gate structures are filled with the silicon nitride film 8 and the silicon oxide film 9. Thereafter, photoresist films 10 are formed to mask the portion where erasing gates are not to be formed in a subsequent step. That is, the photoresist mask is formed on each area corresponding to one of each two of the spaces formed between adjacent two of the laminate gate structures. At this time, no photoresist mask is formed within the peripheral circuit section, as shown in the structure of FIG. 5D.

Figure 5E:
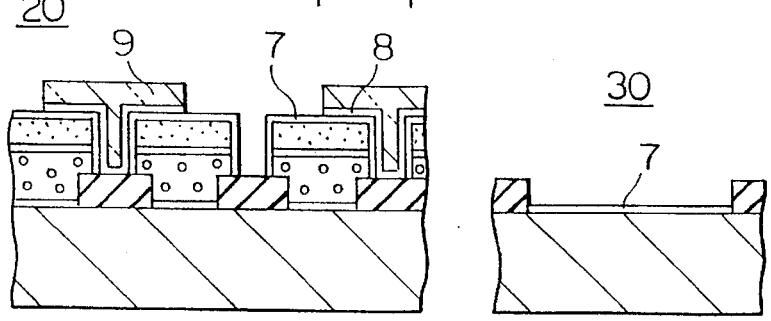

Next, the silicon oxide film 9 and the silicon nitride film 8 are successively subjected to wet etching so as to remove the laminated layers of the silicon oxide film 9 and the silicon nitride film 8 at portions which are not protected by the photoresist films 10, as shown in FIG. 5E. Thereafter, exposed silicon oxide film 7 is removed, and a 100 angstrom thick silicon oxide films 11 are formed by thermal oxidation. The silicon oxide films 11 constitute gate oxide films within the peripheral circuit section.

Figure 5F:
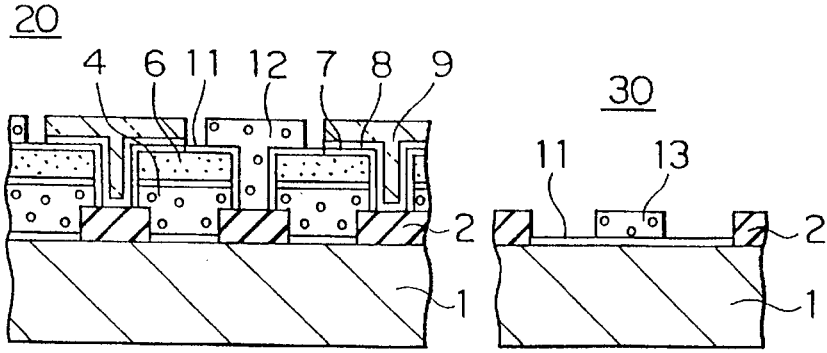

Subsequently, a 2500 angstrom thick polysilicon film for erasing gates is deposited by a CVD technology, then patterned by a photolithographic dry etching technology, so that erasing gates 12 are formed within the cell array section 20 while gate electrodes 13 for peripheral circuit devices are formed within the peripheral circuit section 30, as shown in FIG. 5F. Finally, remaining processes such as formation of interconnects are carried out to complete a nonvolatile semiconductor memory device.

In the first embodiment, the dry etching for forming the erasing gates 12 is carried out at a relatively planar portion, so that etching amount is equivalent between the cell array section and the peripheral circuit section 30. Accordingly, over-etching is prevented to thereby reduce variations in the transistor characteristics of the memory device. In addition, difference in level between the cell array section and the peripheral section is reduced because the erasing gate is not covered by the insulating film for forming the spaces between the gate structures, to thereby prevent the interconnects being broken.

Next, a second embodiment of the present invention will be described.

Referring to FIGS. 6A–6F showing, similarly to FIGS. 5A through 5F, a method for forming an EPROM according to a second embodiment of the present invention, patterning of photoresist film (not shown) and implantation of arsenic ions using the photoresist film are previously performed to a p-substrate 1 within a cell array section, so as to form $n^+$-type buried diffusion layers (not shown) in a surface region of the p-substrate 1. The buried diffusion layers extend parallel to one another in the column direction.

Figure 6A:
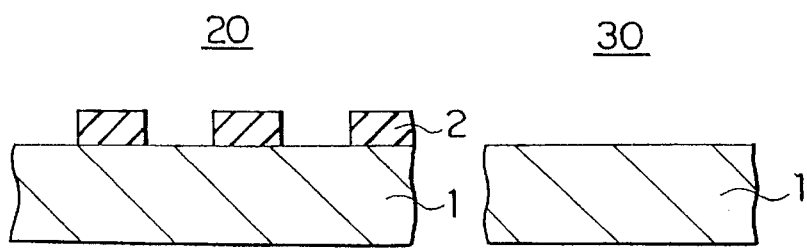
FIGS. 6A–6F are cross-sectional views of a nonvolatile memory device according to a second embodiment of the present invention, showing consecutive steps of a process for manufacturing the same.

A silicon oxide film having a thickness of about 2000 angstroms is deposited on the surface of the silicon substrate 1 by a CVD technology. The silicon oxide film is patterned so as to form field oxide films 2 extending parallel to one another in the row direction. During the patterning process, no field oxide film is formed within the peripheral circuit section 30, as shown in FIG. 6A.

Figure 6B:
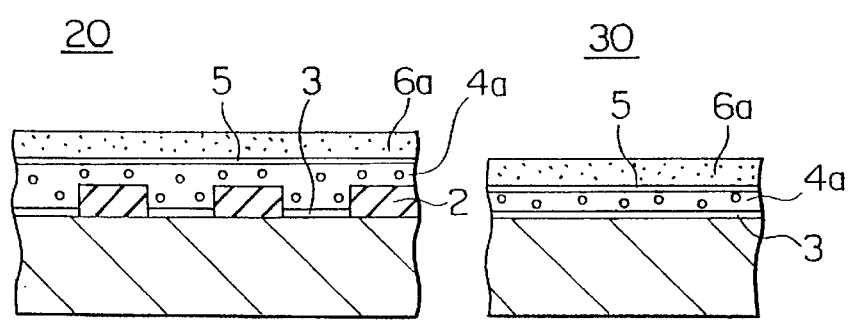

Thereafter, a gate oxide film 3 is formed between adjacent two of the field oxide films 2 by thermal oxidization, and a 2500 angstrom thick polysilicon film is deposited thereon on the entire surface. The 2500 angstrom thick polysilicon film is patterned to obtain polysilicon films 4a for use in forming floating gates. The polysilicon films 4a extend in the column direction, and partially cover the $n^+$-type buried diffusion layers constituting bit lines. At this time, the polysilicon film 4a is also left within the peripheral circuit section 30. A 200 angstrom thick inter-gate oxide film 5 is formed on the entire surface including surface of the polysilicon films 4a, then a polysilicon film 6a for control gates is deposited thereon to a thickness of 3000 angstroms, as shown in FIG. 6B.

Figure 6C:
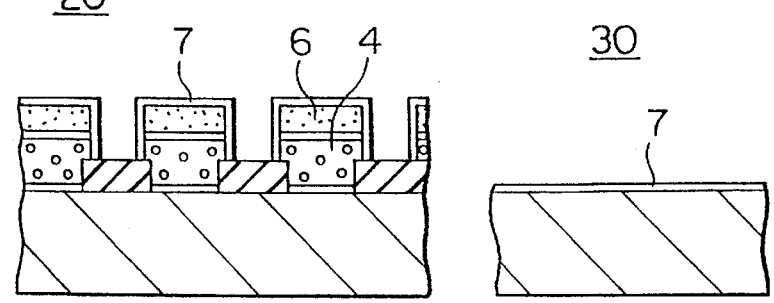

Next, the polysilicon film 6a, the silicon oxide film 5, and the polysilicon films 4a are patterned by photolithographic dry etching so as to form laminate gate structures including a part of the strip control gate 6 and the separate floating gate 4. During the patterning step, the polysilicon is completely removed from the peripheral circuit section 30. After the formation of the laminate gate structures, thermal oxidation is performed to exposed silicon surface to form a 200 angstrom silicon oxide film 7, which covers the control gates, the floating gates and the surface of the silicon substrate (FIG. 6C).

Figure 6D:
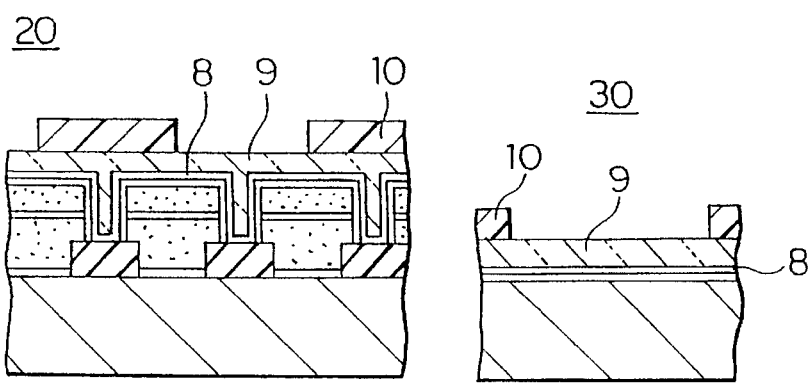

Subsequently, a 500 angstrom thick silicon nitride film 8 and a 5000 angstrom thick silicon oxide film 9 are successively deposited over the entire surface by CVD technology. Thereafter, photoresist films 10 are formed to mask portions where erasing gates are not to be formed in the subsequent step. In the peripheral circuit section 30, the photoresist film 10 is formed as a mask in areas where field oxide films are to be left, as shown in FIG. 6D.

Figure 6E:
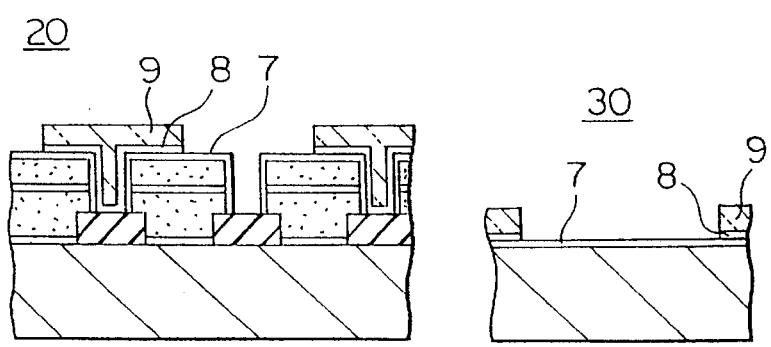

Next, the silicon oxide film 9 and the silicon nitride film 8 are successively subjected to wet etching so as to remove the laminated layers of the silicon oxide film 9 and the silicon nitride film 8 at portions which are not protected by the photoresist films 10, as shown in FIG. 6E. As a result, within the peripheral circuit section 30, the laminated film formed of the 5000 angstrom thick silicon oxide film 9, the 500 angstrom thick silicon nitride film 8 and the 200 angstrom thick silicon oxide film 7 functions for separating the memory cells.

Figure 6F:
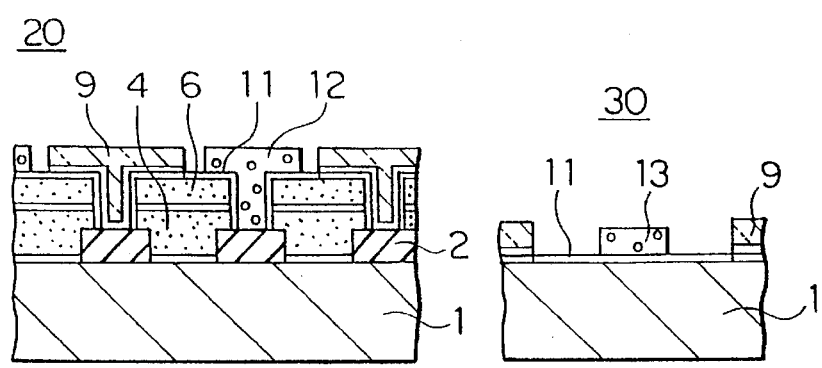

Thereafter, the exposed silicon oxide film 7 is removed, and a 100 angstrom thick silicon oxide film 11 is formed by thermal oxidation. The silicon oxide film 11 constitutes a gate oxide film within the peripheral circuit section 30. Subsequently, a 2500 angstrom thick polysilicon film for use in forming erasing gates is deposited by a CVD technology, then patterned to form erasing gates 12 within the cell array section 20 while to form gate electrodes 13 of peripheral devices within the peripheral circuit section 30, as shown in FIG. 6F. Each of the erasing gates 12 extends within one of each two of the space formed between the laminate gate structures. The erasing gates 12 and insulating films 8 and 9 are disposed alternately in the spaces. Finally, remaining processes such as formation of interconnects are carried out to complete a nonvolatile semiconductor memory device.

In the second embodiment, since both the thicknesses of the field oxide films within the cell array section 20 and within the peripheral circuit section 30 can be optimized separately, the number of the steps can be further decreased. As a result, it is possible to more prevent overlying interconnects from being broken, thereby increasing the yield of the non-volatile memory device.

Since above embodiments are described only for examples, the present invention is not limited to such embodiments and it will be obvious for those skilled in the art that various modifications or alterations can be easily made based on the above embodiments within the scope of the present invention.

What is claimed is:

1. A non-volatile semiconductor memory device comprising a semiconductor substrate, a plurality of floating gates overlying said substrate and arranged in a matrix having a plurality of rows and a plurality of columns, a plurality of strip control gates each overlying each row of said floating gates, a plurality of insulating layers and erasing gates disposed alternately in spaces formed between each adjacent control gate, each of said insulating layers including a silicon nitride film and a silicon oxide film overlying said silicon nitride film.

2. A non-volatile semiconductor memory device as defined in claim 1 further comprising another silicon oxide film underlying said silicon nitride film.

3. A non-volatile semiconductor memory device as defined in claim 1 further comprising a plurality of diffused regions formed in said substrate and extending in said row direction, each of said floating gates partially overlapping said diffused regions.

* * * * *